United States Patent
Chang et al.

(10) Patent No.: US 8,784,986 B2
(45) Date of Patent: Jul. 22, 2014

(54) COATED ARTICLE AND METHOD FOR MANUFACTURING SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Juan Zhang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 118 days.

(21) Appl. No.: 13/284,670

(22) Filed: Oct. 28, 2011

(65) Prior Publication Data

US 2012/0276371 A1 Nov. 1, 2012

(30) Foreign Application Priority Data

Apr. 28, 2011 (CN) .......................... 2011 1 0108134

(51) Int. Cl.
*B23B 27/14* (2006.01)

(52) U.S. Cl.
USPC ............ 428/336; 428/446; 428/698; 428/704

(58) Field of Classification Search
USPC .................................. 428/336, 446, 698, 704
See application file for complete search history.

(56) References Cited

U.S. PATENT DOCUMENTS

| | | | | |
|---|---|---|---|---|
| 7,935,426 | B2 * | 5/2011 | Vetter | 428/698 |
| 8,309,234 | B2 * | 11/2012 | Vetter | 428/697 |
| 8,309,235 | B2 * | 11/2012 | Vetter | 428/698 |
| 2010/0304102 | A1 | 12/2010 | Vetter et al. | |

FOREIGN PATENT DOCUMENTS

JP 2007-126714 * 5/2007

OTHER PUBLICATIONS

Hegnemann et al "PACVD-Derived Thin Films in the System Si-B-C-N" Chem. Vap. Dep. 199, 5, vol. 2 p. 61-65.*
Hegnemann et al "PACVD-Derived Thin Films in the System Si-B-C-N" Chem. Vap. Dep. 1999, 5, vol. 2 p. 61-65.*
Fritz Aldinger et al., "Precursor-derived Si-B-C-N ceramics", Pure & Appl. Chem., vol. 70, No. 2, pp. 439-448, 1998, Printed in Great Britain.
Naohiro Hayashi et al., "Thermal Stability of SiBCN Films", Japanese society of Tribologists, 3, 5(2008), 254-258, Printed in Japan.

* cited by examiner

*Primary Examiner* — Archene Turner
(74) *Attorney, Agent, or Firm* — Novak Druce Connolly Bove + Quigg LLP

(57) ABSTRACT

A coated article includes a substrate and a Si—B—C—N ceramic coating deposited on the substrate by magnetron sputtering process. The Si—B—C—N ceramic coating is an amorphous coating, the weight of elemental Si in the coating is between about 30 wt % and about 60 wt % of the total weight of Si, B, C and N, the weight of elemental B in the coating is between about 10 wt % and about 20 wt % of the total weight of Si, B, C and N, the weight of elemental C in the coating is between about 10 wt % and about 20 wt % of the total weight of Si, B, C and N, the weight of elemental N in the coating is between about 20 wt % and about 30 wt % of the total weight of Si, B, C and N.

3 Claims, 2 Drawing Sheets

COATED ARTICLE AND METHOD FOR MANUFACTURING SAME

BACKGROUND

1. Technical Field

The disclosure generally relates to coated articles and method for manufacturing the coated articles.

2. Description of Related Art

Silicon-boron-carbon-nitride (Si—B—C—N) ceramic has excellent hardness and toughness so it is can be used to form a coating on metal substrates of cutting tools or molds. However, it can be difficult to form a Si—B—C—N ceramic coating on the metal substrate.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coated article and method for manufacturing the coated article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
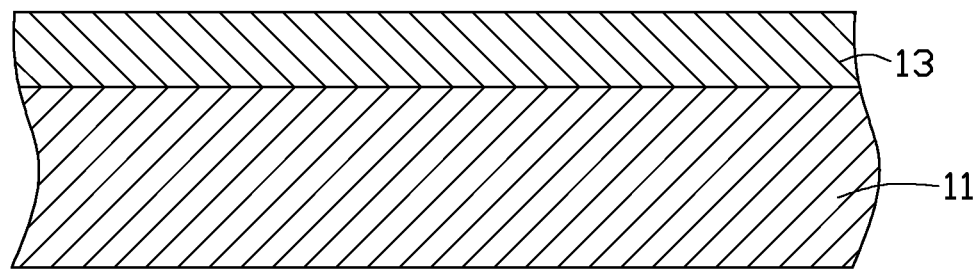
FIG. 1 is a cross-sectional view of an embodiment of a coated article for an electronic device.

Referring to FIG. 1, a coated article 10 includes a substrate 11 and a Si—B—C—N ceramic coating 13 deposited on the substrate 11. The coated article 10 may be a housing of an electronic device.

The substrate 11 may be made of stainless steel, aluminum or aluminum alloy. The Si—B—C—N ceramic coating 13 is an amorphous coating and consists essentially of chemical elements Si, B, C, and N. The weight of elemental Si in the coating is between about 30 wt % and about 60 wt % of the total weight of Si, B, C and N. The weight of elemental B in the coating is between about 10 wt % and about 20 wt % of the total weight of Si, B, C and N. The weight of elemental C in the coating is between about 10 wt % and about 20 wt % of the total weight of Si, B, C and N. The weight of elemental N in the coating is between about 20 wt % and about 30 wt % of the total weight of Si, B, C and N. The Si—B—C—N ceramic coating 13 has a thickness between 100 nanometers (nm) and 1000 nm. The Si—B—C—N ceramic coating 13 may be deposited by magnetron sputtering process.

Figure 2:
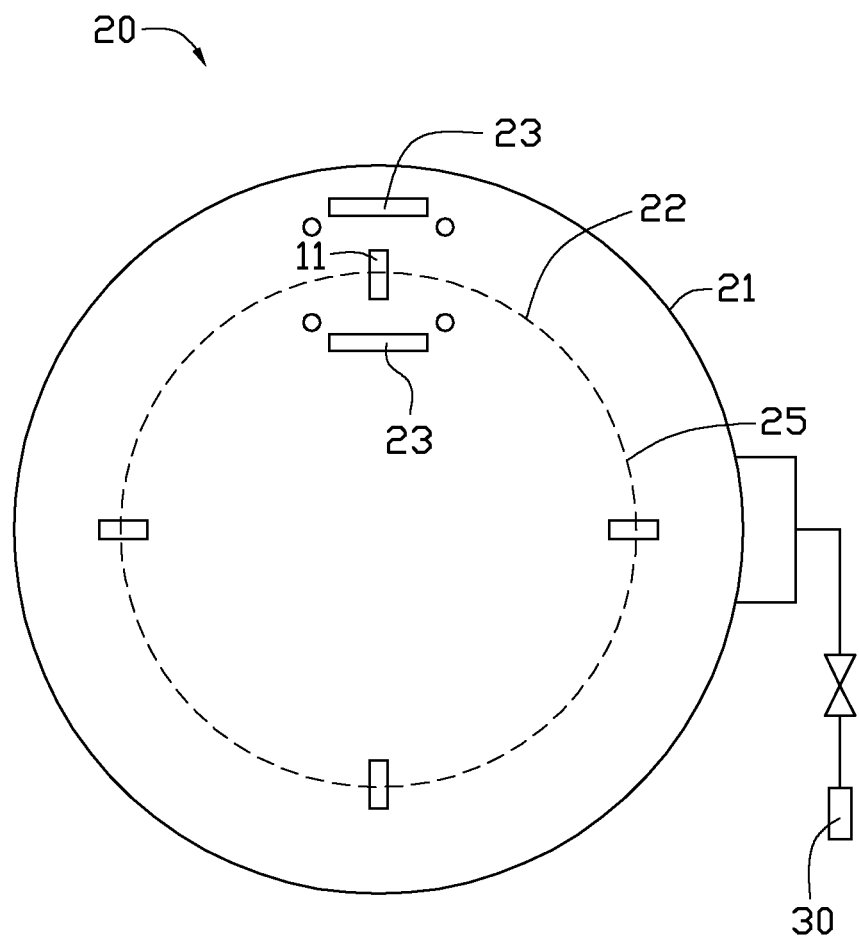
FIG. 2 is a schematic view of a magnetron sputtering coating machine for manufacturing the coated article in FIG. 1.

Referring to FIGS. 1 and 2, a method for manufacturing the coated article 10 includes at least the following steps.

Providing a substrate 11. The substrate 11 may be made of stainless steel, aluminum or aluminum alloy.

Pretreating the substrate 11, by washing it with a solution (e.g., Alcohol or Acetone) in an ultrasonic cleaner for about 30 minutes (min) to 50 min, to remove impurities and contaminations, such as grease, or dirt. The substrate 11 is then dried.

Providing a vacuum sputtering coating machine 20. The vacuum sputtering coating machine 20 includes a sputtering coating chamber 21 and a vacuum pump 30 connecting to the sputtering coating chamber 21. The vacuum pump 30 is used to evacuate the sputtering coating chamber 21. The vacuum sputtering coating machine 20 further includes a rotating bracket 22 and two silicon-boron-nitride (Si—B—N) targets 23. The rotating bracket 22 rotates the substrate 11 in the sputtering coating chamber 21 relative to the Si—B—N targets 23. The Si—B—N targets 23 face each other, and are respectively located on opposite sides of the rotating bracket 22. The weight of elemental Si in each Si—B—N target is between about 12 wt % and about 45 wt % of the total weight of Si, B, and N. The weight of elemental B in each Si—B—N target is between about 10 wt % and about 35 wt % of the total weight of Si, B, and N. The weight of elemental N in each Si—B—N target is between about 40 wt % and about 55 wt % of the total weight of Si, B, and N. The Si—B—N targets 23 are manufactured by powder metallurgy process which may include at least the following steps:

(1) A green material made of the combination of boron-nitride (BN) and $Si_3N_4$ or the combination of boron (B) and $Si_3N_4$ is worked in a ball mill to get a mixed power. The molar ratio of BN:$Si_3N_4$ is 1:1~50, in this exemplary embodiment, is 1:3. The molar ratio of B:$Si_3N_4$ is 1:1~50, in this exemplary embodiment, is 1:3.

(2) The mixed power is then compacted into a green target by cold isostatic pressing at a pressure between 100 MPa and 300 MPa for about 1 min to 10 min.

(3) The green target is put in a discharge plasma sintering furnace to be sintered. The green target is heated at a rate between 90 degrees Celsius per minute (° C./min) and 100° C./min until the temperature of the green target is between about 800° C. and 900° C. A first pressure between 20 MPa and 40 MPa is applied to the green target when the temperature of the green target is between about 800° C. and 900° C., for about 1 min to 40 min. And then, the temperature of the green target is heated to between about 900° C. and 1500° C. and a second pressure between 50 MPa and 70 MPa is applied to the green target for about 3 min to 10 min. After cooled, a finished target 23 is got.

The substrate 11 is then cleaned by argon plasma cleaning. The substrate 11 is retained on the rotating bracket 21 in the sputtering coating chamber 21. The vacuum level inside the sputtering coating chamber 21 is set to about $3.0 \times 10^{-5}$ Torr. Argon gas having a purity of about 99.999% is fed into the sputtering coating chamber 21 at a flow rate about 500 Standard Cubic Centimeters per Minute (sccm). A bias voltage applied to the substrate 11 is between −200 volts (V) to −500 V for about 3 min to 10 min so the argon gas is ionized to plasma. The plasma then strikes the surface of the substrate 11 to clean the surface of the substrate 11. As a result, the bonding force between the substrate 11 and the Si—B—C—N ceramic coating 13 is enhanced.

An Si—B—C—N ceramic coating 13 is deposited on the substrate 11 by magnetron sputtering process. The vacuum level inside the sputtering coating chamber 21 is set to about $3.0 \times 10^{-5}$ Torr. The temperature in the sputtering coating chamber 21 is set between about 50° C. (Celsius degree) and about 100° C. Argon is fed into the sputtering coating chamber 21 at a flux between about 300 sccm and about 500 sccm. Acetylene is fed into the sputtering coating chamber 21 at a flux between about 10 sccm and about 100 sccm. The Si—B—N targets 23 in the sputtering coating chamber 21 are evaporated at a power between about 3 kW and about 5 kW. A bias voltage applied to the substrate 11 may be between about −50 volts and about −180 volts for between about 20 minutes and about 60 minutes, to deposit the Si—B—C—N ceramic coating 13 on the substrate 11.

Atomic boron in the Si—B—C—N ceramic coating 13 is introduced by magnetron sputtering the Si—B—N targets 23, which can avoid introducing impurities in the Si—B—C—N ceramic coating 13 during depositing the Si—B—C—N ceramic coating 13. Additionally, the Si—B—C—N ceramic coating 13 mainly includes compounds composited silicon element and carbon element, or silicon element and nitride element or carbon element and nitride element, such as silicon carbide, silicon nitride or carbon nitride, which can prevent exterior oxygen from diffusing in the Si—B—C—N ceramic coating 13 when the Si—B—C—N ceramic coating 13 is located in high temperature and oxygen environment.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A coated article, comprising:
   a substrate; and
   a Si—B—C—N ceramic coating deposited on the substrate by magnetron sputtering process using Si—B—N as targets and using acetylene as reactant gas;
   wherein the Si—B—C—N ceramic coating is an amorphous coating and consists essentially of chemical elements Si, B, C, and N, the weight of elemental Si in the coating is between about 30 wt % and about 60 wt % of the total weight of Si, B, C and N, the weight of elemental B in the coating is between about 10 wt % and about 20 wt % of the total weight of Si, B, C and N, the weight of elemental C in the coating is between about 10 wt % and about 20 wt % of the total weight of Si, B, C and N, the weight of elemental N in the coating is between about 20 wt % and about 30 wt % of the total weight of Si, B, C and N.

2. The coated article as claimed in claim 1, wherein the substrate is made of stainless steel, aluminum or aluminum alloy.

3. The coated article as claimed in claim 1, wherein the Si—B—C—N ceramic coating has a thickness between 100 nm and 1000 nm.

* * * * *